United States Patent
Lee

(10) Patent No.: US 7,274,271 B2
(45) Date of Patent: Sep. 25, 2007

(54) SIGNAL TRANSMISSION STRUCTURE HAVING ALIGNMENT HOLE FOR COAXIAL CABLE CONNECTOR

(75) Inventor: Sheng-Yuan Lee, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 5 days.

(21) Appl. No.: 11/162,041

(22) Filed: Aug. 26, 2005

(65) Prior Publication Data

US 2006/0208835 A1    Sep. 21, 2006

(30) Foreign Application Priority Data

Mar. 16, 2005   (TW) .............................. 94107987 A

(51) Int. Cl.
*H01P 5/02* (2006.01)
*H01P 1/04* (2006.01)

(52) U.S. Cl. ........................................ 333/33; 333/260

(58) Field of Classification Search ................ 333/260, 333/246, 33
See application file for complete search history.

(56) References Cited

U.S. PATENT DOCUMENTS

| 3,201,722 | A | * | 8/1965 | May et al. ..................... 333/33 |
| 4,994,771 | A | * | 2/1991 | Takamine et al. ............. 333/33 |
| 6,992,544 | B2 | * | 1/2006 | Barnes et al. ................. 333/33 |

* cited by examiner

*Primary Examiner*—Benny Lee
(74) *Attorney, Agent, or Firm*—Jianq Chyun IP Office

(57) ABSTRACT

A signal transmission structure is provided. The signal transmission structure includes a circuit board, a coaxial cable connector, and a conductive layer; the aforementioned circuit board includes at least one alignment through hole, a signal pad, and a signal trace connected to the signal pad. Additionally, the signal pad and the signal trace are disposed on a surface of the circuit board. In addition, the alignment through hole passes through the circuit board. The coaxial cable connector is located on a surface of the circuit board. The coaxial cable connector has a signal pin and at least an alignment pin, and the alignment pin is inserted into the alignment through hole. The conductive layer is located between one end of the signal pin and the signal pad, and the signal pin is electrically connected to the signal pad via the conductive layer.

14 Claims, 6 Drawing Sheets

SIGNAL TRANSMISSION STRUCTURE HAVING ALIGNMENT HOLE FOR COAXIAL CABLE CONNECTOR

CROSS-REFERENCE TO RELATED APPLICATION

This application claims the priority benefit of Taiwan application serial no. 94107987, filed on Mar. 16, 2005. All disclosure of the Taiwan application is incorporated herein by reference.

BACKGROUND OF THE INVENTION

1. Field of Invention

The present invention relates to signal transmission structure. More particularly, the present invention relates to a signal transmission structure which comprises a circuit board and a coaxial cable connector.

2. Description of Related Art

On the large-scale printed circuit board (PCB) and the packaging substrate, the signal lines between two nodes or between two ends are electrically connected while maintaining a consistent wire width, so that the characteristic impedance of the signal wire can be maintained constant while the electric signal is transmitted via the signal lines. And, especially in transmitting the high-speed and high-frequency signals, the two ends require a better impedance-matching design to reduce the reflection resulted from the impedance mismatch; that is, to reduce the insertion loss and relatively increase the return loss when the signal is transmitting, so as to reduce negative impact upon the quality of transmitting signal.

FIG. 1A is a top view of a conventional upright SMA (Sub-Minature type A) connector assembled to a circuit board, and FIG. 1B is the top view of the circuit board in FIG. 1A. FIG. 1C and FIG. 1D are the cross-sectional views of line A-A' and line B-B' of FIG. 1A, respectively. Referring to FIG. 1A to FIG. 1D, the conventional circuit board 100 has a signal through hole 100a and a plurality of alignment Through holes 100b; wherein, the signal through hole 100a and these alignment through holes 100b all extend through the conventional circuit board 100. Additionally, the conventional circuit board 100 also has a plurality of alignment hole pads 116, a signal hole pad 112, and a signal trace 114 connected to one of the signal hole pads 112 on a surface thereof. The signal hole pad 112 surrounds the signal through hole 100a, and the alignment hole pads 116 surround the alignment through holes 100b respectively. Additionally, the conventional circuit board 100 also has a internal reference plane 120 (FIGS. 1C, 1D), which can be a ground plane or a power plane; wherein, these alignment hole pads 116 are electrically connected to the internal reference plane 120.

The conventional upright SMA connector 200 is also a coaxial cable connector, and the conventional upright SMA connector 200 is disposed on the circuit board 100. The conventional upright SMA connector 200 has a signal pin 210 and a plurality of alignment pins 220, wherein the signal pin 210 is inserted into and soldered to the signal through hole 100a, and the signal pin 210 is electrically connected to the signal hole pad 112. Therefore, the signal from the conventional upright SMA connector 200 can transmit to the signal trace 114 via the signal pin 210 and the signal hole pad 112 in sequence. Additionally, these alignment pins 220 are inserted into and soldered to the signal through holes 100b, and these alignment pins 220 are electrically connected to these alignment hole pads 116. Using the same method, these alignment pins 220 can be electrically connected to the internal reference plane 120 via these alignment hole pads 116.

The relatively larger signal pin 210 (the diameter of the signal pin 210 is 1 mm, for example as seen in FIG. 1C) requires a relatively larger signal hole pad 112 on the circuit board 100, however, the relatively larger signal hole pad 112 may induce relatively serious parasitic capacitance effect. In other words, the transmission quality may be diminished due to the derived high capacitance of the signal pin 210 when the signal is transmitted from the signal pin 210 to the signal hole pad 112. Additionally, as the extending part of the signal pin 210 passing through the circuit board 100 creates parasitic capacitance, the quality of the signal transmission may further diminish. Note that the quality of the signal transmission may be more seriously degraded when the signal transmitted byte signal pin 210 is of high-frequency signal.

SUMMARY OF THE INVENTION

Accordingly, an objective of the present invention is to improve upon the quality of the signal transmission between a coaxial cable connector and a circuit board.

Based upon the above or other objective, the present invention provides a signal transmission structure, which comprises a circuit board, a coaxial cable connector, and a conductive layer; wherein, the circuit board comprises at least one alignment through hole, a signal pad, and a signal trace connected to the signal pad. Additionally, the signal pad and the signal trace are located on a surface of the circuit board, and the alignment through hole passes through the circuit board. The coaxial cable connector is disposed on the surface of the circuit board. The coaxial cable connector has a signal pin and at least one alignment pin; wherein, the alignment pin is inserted into the alignment through hole. The conductive layer is disposed between one end of the alignment pin and the signal pad; and the signal pin is electrically connected to the signal pad via the conductive layer.

The above-mentioned circuit board may further comprise at least one alignment hole pad on its surface, and the alignment pin is inserted into the alignment through hole and pass through the alignment hole pad. Moreover, the circuit board may further have an internal reference plane, and the alignment pin is connected to the internal reference plane. Furthermore, the internal reference plane can be a ground plane or a power plane. Moreover, the above-mentioned conductive layer material can be solder or conductive paste.

The outer diameter of the above-mentioned signal pin can be larger than the width of the signal trace.

Based on the above or other objectives, the present invention provides a signal transmission structure, which comprises a circuit board, a coaxial cable connector, and a conductive layer; wherein, the circuit board comprises at least one ground plane, at least one ground through hole electrically connected to the ground plane, a signal pad, and a signal trace connected to the signal pad. The signal pad and the signal trace are disposed on a surface of the circuit board, and the alignment through hole extends through the circuit board. The coaxial cable connector is disposed on the surface of the circuit board; it has a signal pin and at least one ground pin, wherein the ground pin is inserted into the ground through hole. The conductive layer is disposed between one end of the signal pin and the signal pad, and the signal pin is electrically connected to the signal pad via the conductive layer.

The above-mentioned circuit board may further comprise at least one ground hole pad on the surface, and the ground pin is inserted into the ground through hole and passes through the ground hole pad. Moreover, the above-mentioned conductive layer material can be solder or conductive paste. Additionally, the outer diameter of the signal pin can be larger than the width of the signal trace. And, the outer diameter of the signal pin can be larger than the outer diameter of the signal pad.

Based on the above-mentioned factors such as the shortened protrusion length of the signal pin, and one conductive layer disposed between one end of the shortened signal pin and the signal pad, the high capacitance and the derived parasitic capacitance can be reduced, thus the signal transmission structure of the present invention is able to obtain better quality of signal transmission.

In order to make the aforementioned and other objects, features and advantages of the present invention comprehensible, a preferred embodiment accompanied with figures is described in detail below.

DETAIL DESCRIPTION OF THE PREFERRED EMBODIMENTS

Figure 1A:
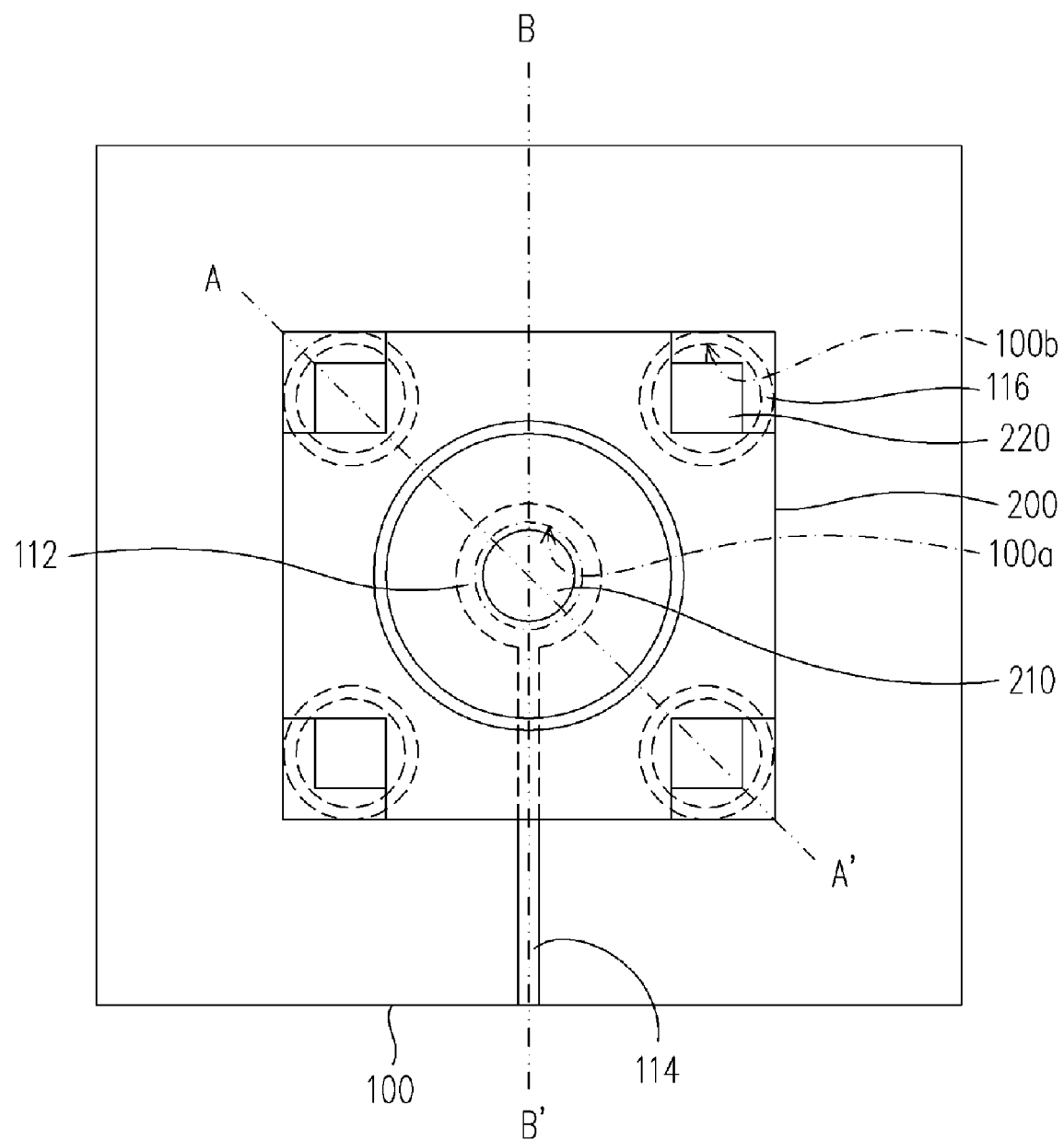
FIG. 1A is a top view of a conventional upright SMA (Sub-Miniature type A) connector assembled to a circuit board.
Figure 1B:
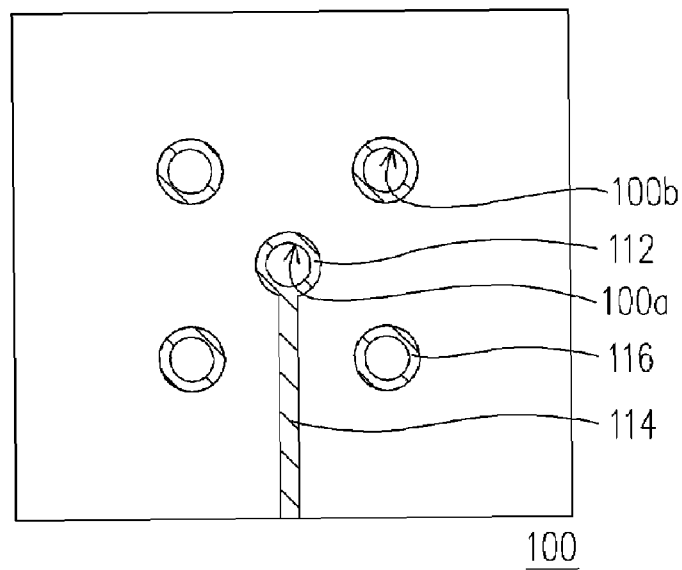
FIG. 1B is a top view of a circuit board in FIG. 1A.
Figure 1C:
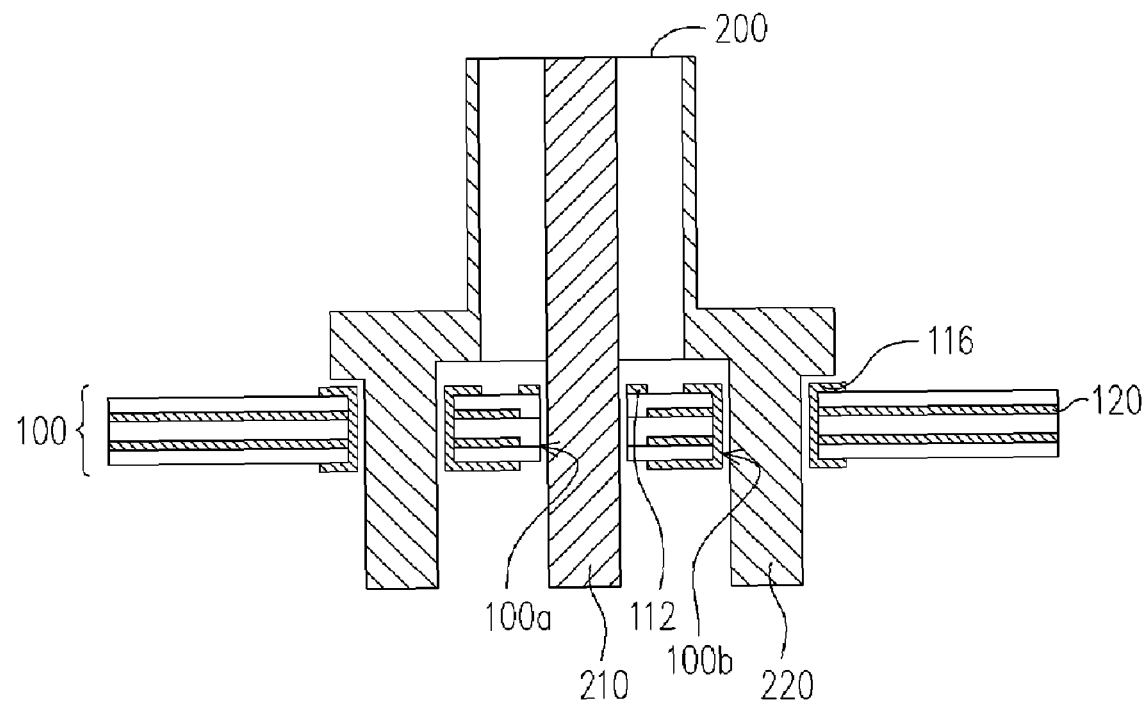
FIG. 1C and FIG. 1D are cross-sectional views through line A-A' and line B-B' of FIG. 1A respectively.
Figure 1D:
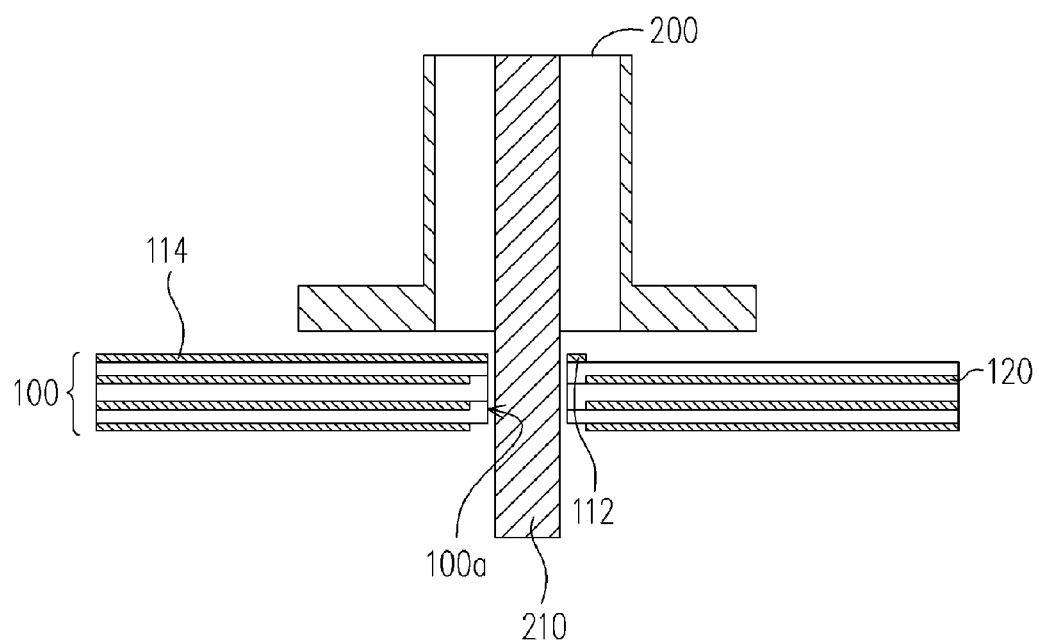
Figure 2A:
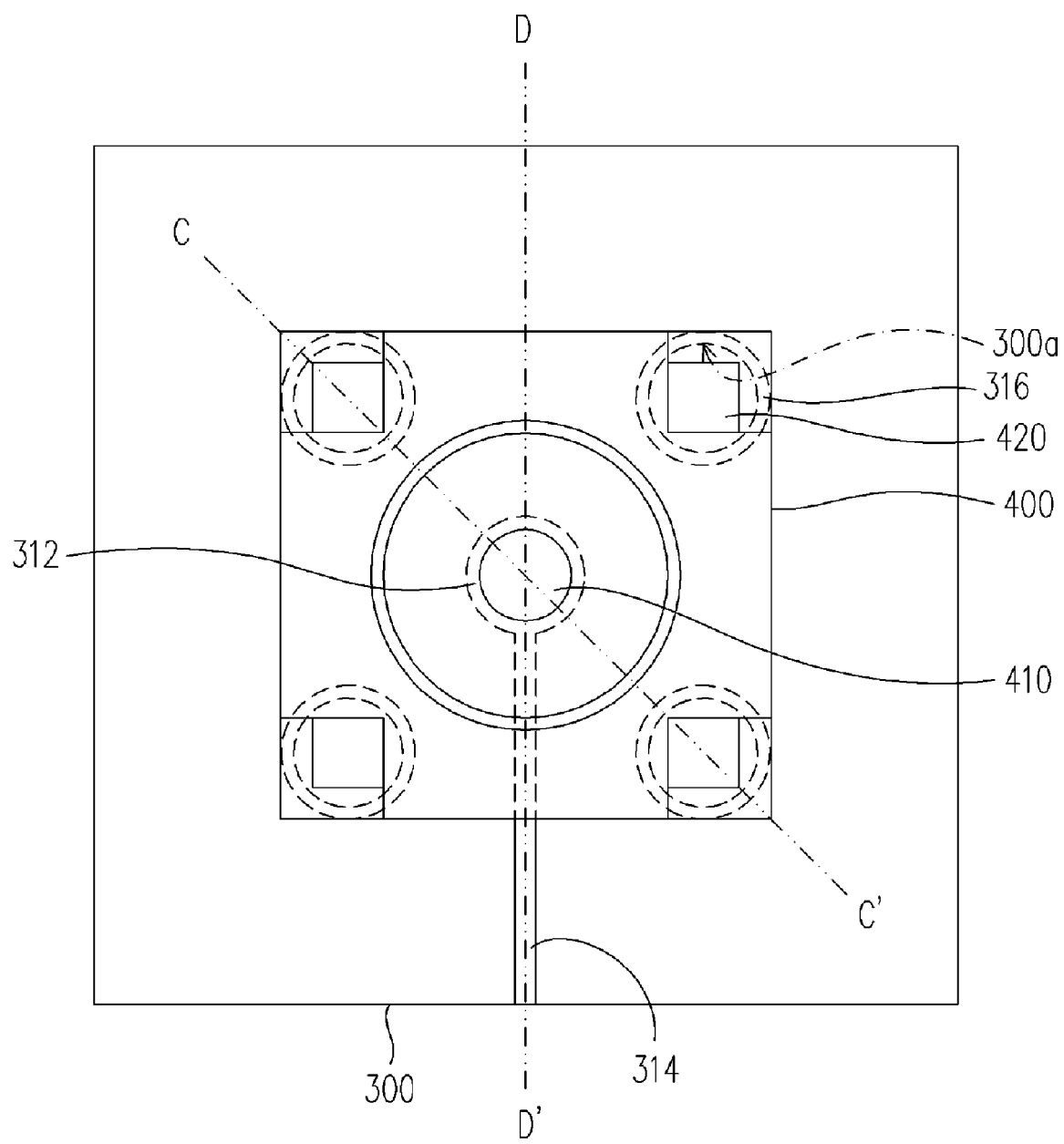
FIG. 2A is a top view of a signal transmission structure of an embodiment according to the present invention.
Figure 2B:
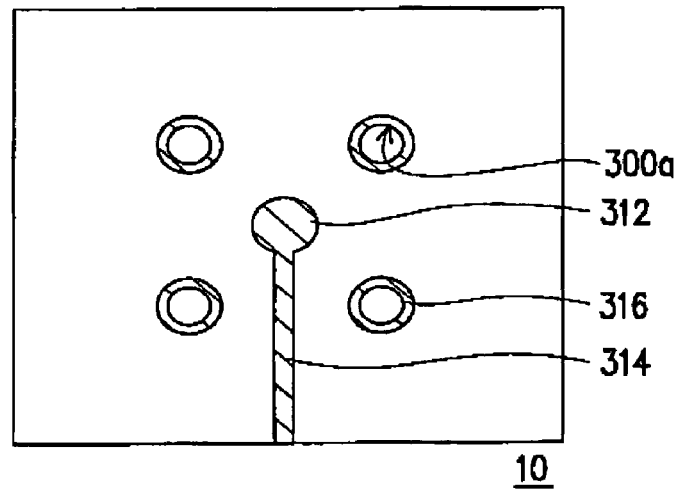
FIG. 2B is a top view of a circuit board in FIG. 2A.
Figure 2C:
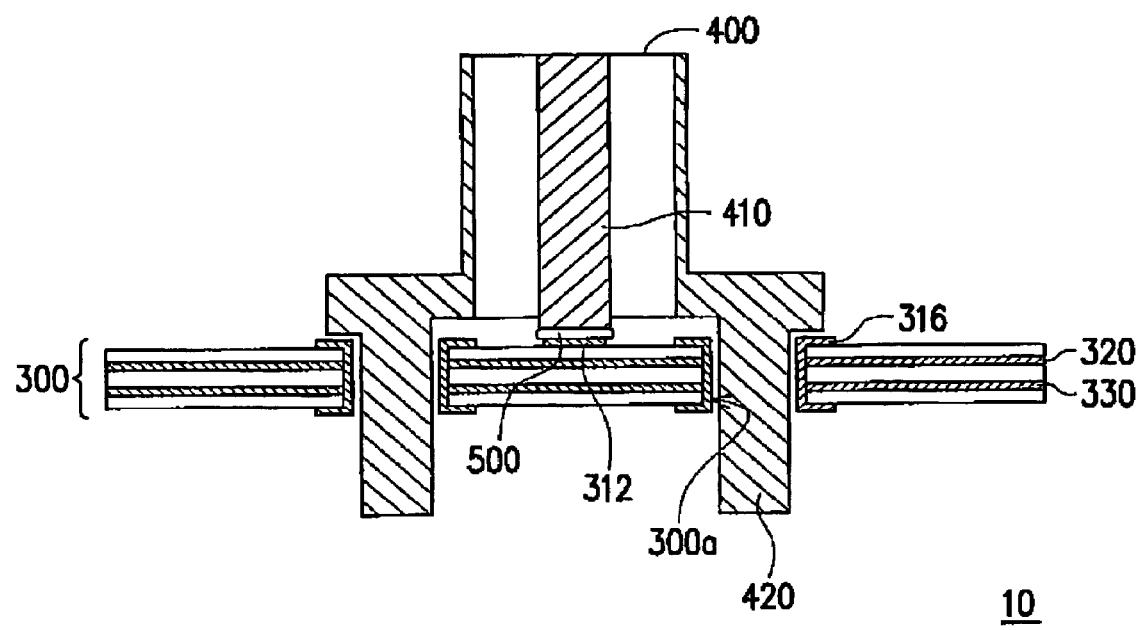
FIG. 2C and FIG. 2D are cross-sectional views through line C-C' and line D-D' of FIG. 2A respectively.
Figure 2D:
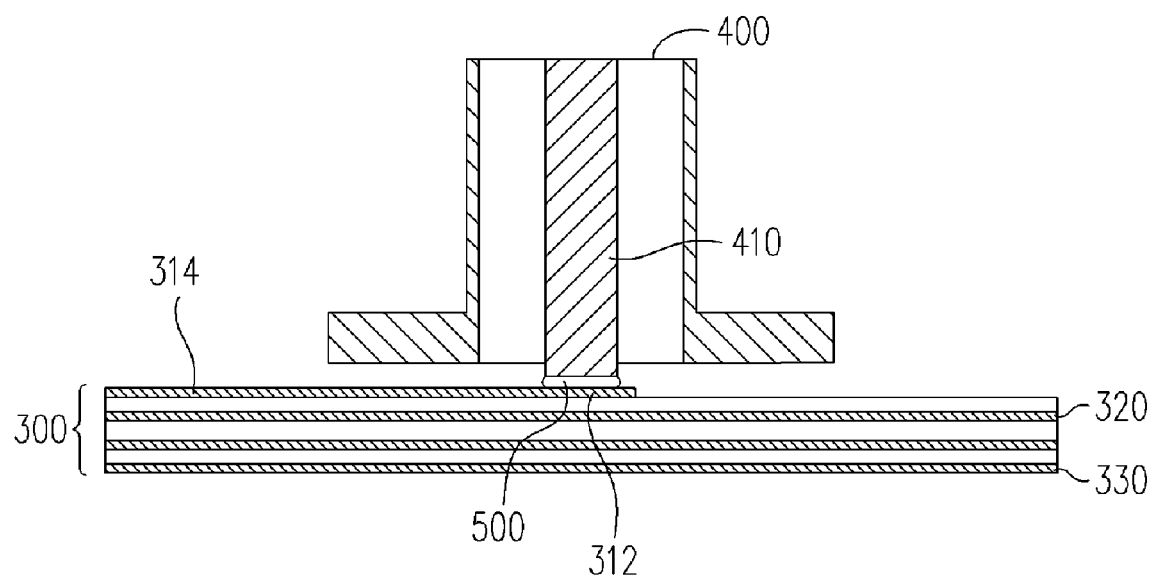

FIG. 2A is a top view of a signal transmission structure of an embodiment according to the present invention, and the FIG. 2B is a top view of the circuit board in FIG. 2A. FIG. 2C and FIG. 2D are cross-sectional views through line C-C' and line D-D' of FIG. 2A respectively. Referring to FIG. 2A to FIG. 2D, the signal transmission structure 10 comprises a circuit board 300, a coaxial cable connector 400, and a conductive layer 500 (FIGS. 2C, 2D), wherein the circuit board 300 comprises at least one alignment through hole 300a (FIG. 2C), a signal pad 312, and a signal trace 314 connected to the signal pad 312. The signal pad 312 and the signal trace 314 are on one surface of the circuit board 300, and the alignment though hole 300a passes through the circuit board 300.

The coaxial cable connector 400 is disposed on the surface of the circuit board 300. Additionally, the coaxial cable connector 400 has a signal pin 410 and at least one alignment pin 420, wherein the alignment pin 420 is soldered and inserted into the alignment through hole 300a for the strong bonding between the coaxial cable connector 400 and the circuit board 300. In the embodiment, the coaxial cable connector 400 is an upright SMA connector as best seen in FIGS. 2C, 2D, and the coaxial cable connector 400 has four alignment pins 420, while the circuit board 300 correspondingly has four alignment through holes 300a. Additionally, the conductive layer 500 is disposed between one end of the signal pin 410 and the signal pad 312. In other words, the signal pin 410 is connected to the signal pad 312 by adapting surface mount technology (SMT). Therefore, the signal transmitted by the coaxial cable connector 400 can reach the signal pad 312 via the signal pin 410 and the conductive layer 500.

The material of the conductive layer 500 comprises solder, conductive paste or other conductive materials. Additionally, in the embodiment, the outer diameter of the signal pin 410 can be larger than the width of the signal trace 314, and the outer diameter of the signal pin 410 can be larger than the outer diameter of the signal pad 312 (FIG. 2C).

The above-mentioned circuit board 300 may further have a internal reference plane 320 (FIGS. 2C, 2D) located internally, and the internal reference plane 320 can be a ground plane or a power plane. Additionally, the alignment pin 420 is connected to the internal reference plane 320 or 330 (FIGS. 2C. 2D). Whenever the alignment pin 420 is connected to the ground plane, the corresponding alignment pin 420 can also be called a ground pin. Additionally, the circuit board 300 can also have a plurality of alignment hole pads 316 on the residing surface for the alignment pins 420, and the alignment pins 420 are respectively inserted into and soldered in these alignment through holes 300a, and pass through the alignment hole pads 316 at the same time. Therefore, when these alignment hole pads 316 are connected to the internal reference plane 320 or other internal reference planes, these alignment pins 420 can also be electrically connected to the internal reference plane 320 or other internal reference planes via these alignment hole pads 316.

It should be noted that the signal trace 314 is not limited to a straight line; whereas, the signal trace 314 can be of various patterns. Moreover, the number of these alignment through holes 300a is not limited to four, but can be adjusted with respect to the corresponding number of the alignment pins 420.

Compared with the conventional technology, the protrusion length of the signal pin 410 connected to the coaxial cable connector 400 is shortened, thus the high capacitance and the derived parasitic capacitance are reduced in the present invention. Therefore, the signal transmission structure 10 of the present invention is able to achieve better quality of signal transmission. Moreover, there's no further need to change much of the design of the coaxial cable connector 400 while the signal pins are shortened. Additionally, the design of the circuit board 300 can also be simplified to reduce the manufacturing difficulty. Moreover, the coaxial cable connector 400 is still affixed on the circuit board 300 by at least one alignment pin 420, therefore, enough structure strength can still be maintained between the circuit board 300 and the coaxial cable connector 400.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal transmission structure, comprising:
   a circuit board, having at least one alignment through hole, a signal pad, and a signal trace connected to the signal pad, wherein the signal pad and the signal trace are disposed on a surface of the circuit board, and the at least one alignment through hole passes through the circuit board;

a coaxial cable connector, disposed on the surface of the circuit board, the coaxial cable connector comprising a signal pin and at least one alignment pin, wherein the at least one alignment pin is inserted into the at least one alignment through hole; and a conductive layer, disposed between one end of the signal pin and the signal pad, the signal pin being electrically connected to the signal pad via the conductive layer.

2. The signal transmission structure as claimed in claim 1, wherein the circuit board further comprises at least one alignment hole pad on the surface, and the at least one alignment pin is inserted into the at least one alignment through hole and passes through the at least one alignment hole pad.

3. The signal transmission structure as claimed in claim 2, wherein the circuit board further comprises an internal reference plane, and the alignment pin is connected to the internal reference plane.

4. The signal transmission structure as claimed in claim 3, wherein the internal reference plane is a ground plane or a power plane.

5. The signal transmission structure as claimed in claim 1, wherein a material of the conductive layer comprises solder.

6. The signal transmission structure as claimed in claim 1, wherein a material of the conductive layer comprises conductive paste.

7. The signal transmission structure as claimed in claim 1, wherein an outer diameter of the signal pin is larger than a width of the signal trace.

8. The signal transmission structure as claimed in claim 7, wherein an outer diameter of the signal pin is larger than an outer diameter of the signal pad.

9. A signal transmission structure, comprising:
a circuit board, comprising at least one ground plane, at least one ground through hole electrically connected to the ground plane, a signal pad, and a signal trace connected to the signal pad, wherein the signal pad and the signal trace are disposed on a surface of the circuit board, and the ground through hole passes through the circuit board, a coaxial cable connector, disposed on the surface of the circuit board, the coaxial cable connector comprising a signal pin and at least one ground pin, wherein the at least one ground pin is inserted into the at least one ground through hole; and a conductive layer, disposed between one end of the signal pin and the signal pad, wherein the signal pin is electrically connected to the signal pad via the conductive layer.

10. The signal transmission structure as claimed in claim 9, wherein the circuit board further comprises at least one ground hole pad on the surface thereof, and the at least one ground pin is inserted into the at least one ground through hole and passes through the at least one ground hole pad.

11. The signal transmission structure as claimed in claim 9, wherein a material of the conductive layer comprises solder.

12. The signal transmission structure as claimed in claim 9, wherein a material of the conductive layer comprises conductive paste.

13. The signal transmission structure as claimed in claim 9, wherein an outer diameter of the signal pin is larger than a width of the signal trace.

14. The signal transmission structure as claimed in claim 9, wherein an outer diameter of the signal pin is larger than an outer diameter of the signal pad.

* * * * *